United States Patent
Sprouse et al.

(10) Patent No.: US 8,848,445 B2
(45) Date of Patent: Sep. 30, 2014

(54) SYSTEM AND METHOD FOR MINIMIZING WRITE AMPLIFICATION WHILE MAINTAINING SEQUENTIAL PERFORMANCE USING LOGICAL GROUP STRIPING IN A MULTI-BANK SYSTEM

(75) Inventors: Steven T. Sprouse, San Jose, CA (US); Sergey Anatolievich Gorobets, Edinburgh (GB); William Wu, Cupertino, CA (US); Alan Bennett, Edinburgh (GB); Marielle Bundukin, Hayward, CA (US)

(73) Assignee: SanDisk Technologies Inc., Plano, TX (US)

( * ) Notice: Subject to any disclaimer, the term of this patent is extended or adjusted under 35 U.S.C. 154(b) by 180 days.

(21) Appl. No.: 13/474,055

(22) Filed: May 17, 2012

(65) Prior Publication Data
US 2012/0320679 A1 Dec. 20, 2012

Related U.S. Application Data

(60) Provisional application No. 61/487,213, filed on May 17, 2011, provisional application No. 61/487,594, filed on May 18, 2011.

(51) Int. Cl.
*G11C 11/34* (2006.01)

(52) U.S. Cl.
USPC .................................. 365/185.12; 365/189.16

(58) Field of Classification Search
USPC ........... 365/185.12, 189.14, 189.16; 711/103, 711/170, 173
See application file for complete search history.

(56) References Cited

U.S. PATENT DOCUMENTS

| | | | |
|---|---|---|---|
| 7,032,065 B2 * | 4/2006 | Gonzalez et al. | 711/103 |
| 7,412,560 B2 * | 8/2008 | Smith et al. | 711/103 |
| 7,894,269 B2 * | 2/2011 | Li | 365/185.22 |
| 7,913,055 B2 * | 3/2011 | Karamcheti et al. | 711/203 |
| 7,941,696 B2 * | 5/2011 | Frost et al. | 714/6.2 |

* cited by examiner

*Primary Examiner* — Son Dinh
(74) *Attorney, Agent, or Firm* — Brinks Gilson & Lione (57) ABSTRACT

A system and method for reducing write amplification while maintaining a desired level of sequential read and write performance is disclosed. A controller in a multi-bank flash storage device may receive host data for writing to the plurality of flash memory banks. The controller may organize the received data in multi-page logical groups greater than a physical page and less than a physical block and interleave writes of the host data to the memory banks with that striping factor. A buffer RAM is associated with each bank of the multi-bank memory where the buffer RAM is sized as equal to or greater than the size of the multi-page logical group.

14 Claims, 6 Drawing Sheets

SYSTEM AND METHOD FOR MINIMIZING WRITE AMPLIFICATION WHILE MAINTAINING SEQUENTIAL PERFORMANCE USING LOGICAL GROUP STRIPING IN A MULTI-BANK SYSTEM

CROSS-REFERENCE TO RELATED APPLICATIONS

This application claims the benefit of U.S. Provisional Application Nos. 61/487,213, filed May 17, 2011, and 61/487,594, filed May 18, 2011, and the entirety of each is hereby incorporated herein by reference.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device.

In recent years, the physical block size in NAND flash memory has been growing exponentially: from about 128K in 2006 to over 4 MB in 2011. As block sizes increase, usage patterns that used to fill an entire 128K block are now only writing a partial 4 MB block. For example, a random write may be considered a write operation that results in writing data that takes up less than an entire block of memory. A sequential write may be considered a write operation that fills a block entirely. Thus, while a 128K write to a flash memory with a 128K block size may have been considered a sequential write operation, that same 128K write pattern is essentially a random write in a flash memory having a 4 MB block size. This results in an increased write amplification factor, where the write amplification factor is defined as the number of bytes that are written to NAND flash divided by the number of bytes actually written by the host. In multi-bank memory systems, bank interleaving can make this problem worse because the effective system "mega-block" size is increased by the number of banks in the system.

Previous NAND flash management systems have been at extremes of the NAND geometry spectrum. At one end is the physical page based architecture which typically manages a 4-16 KB page. At the other end of the spectrum is a block based architecture which often manages blocks or meta-blocks on the order of 1 MB-32 MB in size. Both page and block based memory management systems typically use bank interleaving at the physical page or die page level (generally 4K-32K). Bank interleaving is typically done because it can give good sequential and random performance and requires a minimum amount of buffer RAM. However, the benefits obtained in bank interleaving can be offset by an increase in the system write amplification factor by a factor equal to the number of banks in the system.

SUMMARY

In order to address the problems noted above, a method and system for maintaining a multi-block parallelism for sequential read and write performance and limiting write amplification is provided. The system may include a flash memory device having multiple banks of flash memory storage, buffer RAM associated with each of the flash memory banks and a controller for managing the memory banks. The controller is configured to manage host data through a multi-page group (MPG), where the MPG has a size larger than a physical page and smaller than a physical block in the flash memory banks. The buffer RAM for each of the flash memory banks is sized to be at least as large as the MPG size. The controller is further configured to interleave data writes between banks at a MPG granularity, where an entire MPG is written to a first bank before writing a next MPG of data to a next bank.

According to another aspect, a method is disclosed for limiting write amplification and maintaining a multi-block parallelism for sequential read and write performance. The method includes, in a multi-bank flash memory device having multiple banks of flash storage and a respective buffer RAM associated with each of the multiple banks where the buffer RAM has a size equal to or greater than a multi-page group (MPG), the controller receiving data from a host for writing into the multiple banks of flash storage. The controller, in response to receiving the host data, writing data to a first bank in an amount equal to the MPG, where a size of the MPG is greater than a physical page size, and less than a physical block size, of the multiple banks of flash storage. The controller interleaves data writing between each of the multiple banks of flash storage at a MPG granularity, such that a block of a bank receives data in an amount of an MPG before the controller writes to a block of a next of the multiple banks of flash storage.

BRIEF DESCRIPTION OF THE PRESENTLY PREFERRED EMBODIMENTS

Figure 1:
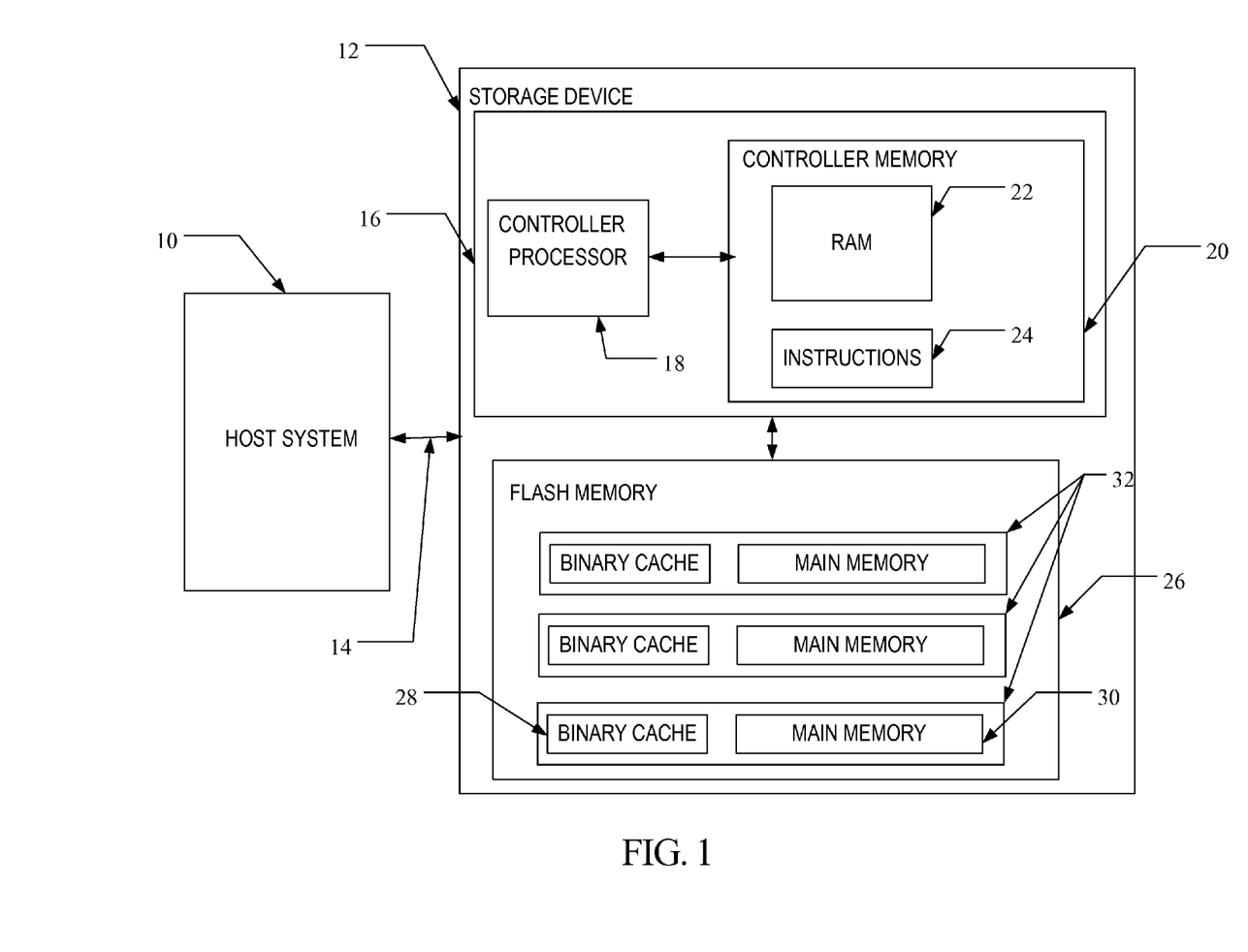
FIG. 1 is a block diagram of a self-caching, multi-bank memory system.

A flash memory system suitable for use in implementing aspects of the invention is shown in FIG. 1. A host system 10 stores data into, and retrieves data from, a self-caching storage device 12. The storage device 12 may be embedded in the host system 10 or may exist in the form of a card or other removable drive, such as a solid state disk (SSD) that is removably connected to the host system 10 through a mechanical and electrical connector. The host system 10 may be any of a number of fixed or portable data generating devices, such as a personal computer, a mobile telephone, a personal digital assistant (PDA), or the like. The host system 10 communicates with the storage device over a communication channel 14.

The storage device 12 contains a controller 16 and a memory 26. As shown in FIG. 1, the controller 16 includes a processor 18 and a controller memory 20. The processor 18 may comprise a microprocessor, a microcontroller, an application specific integrated circuit (ASIC), a field programmable gate array, a logical digital circuit, or other now known or later developed logical processing capability. The controller memory 20 may include volatile memory such as random access memory (RAM) 22 and/or non-volatile memory, and processor executable instructions 24 for handling memory management. The storage device 12 also includes a flash memory 26 having a plurality of banks 32 of flash memory, such as NAND flash memory, which may each have one or more partitions, such as a binary cache section 28 and a main storage section 30. The binary cache section 28 may be single level cell (SLC) flash and the main storage section may be multi-level cell (MLC) flash in one embodiment.

Figure 4:
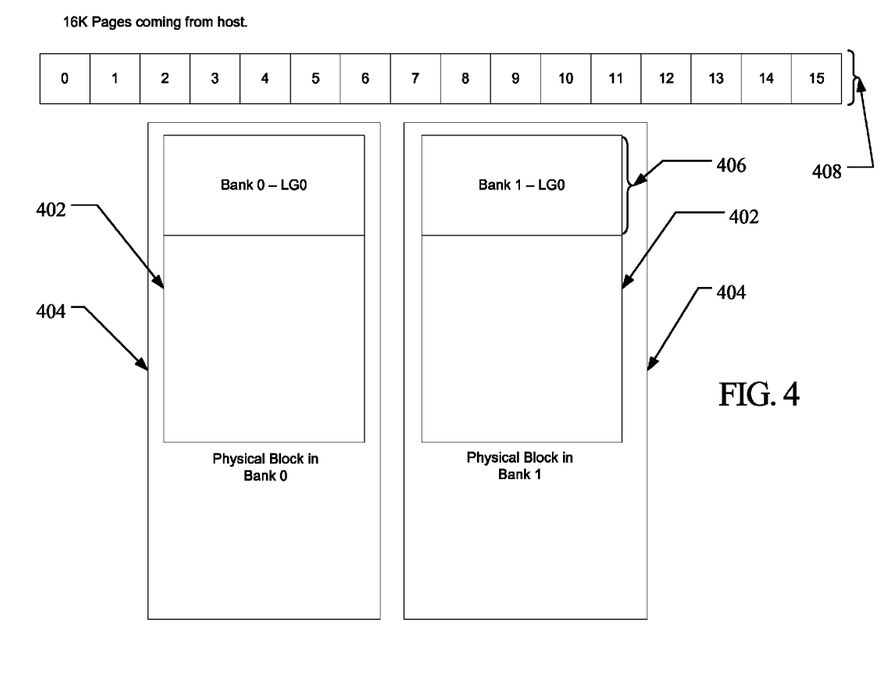
FIG. 4. shows an incoming data write from a host and an example multi-bank memory arrangement.

In one implementation, the processor 18 of the storage device 12 may execute memory management instructions 23 (which may be resident in instructions 24) for operation of the memory management functions, such as detailed in FIG. 4. The memory management functions may control the assignment of the one or more portions of the memory within storage device 12, such as within controller memory 20. For example, memory management functions may allocate a RAM portion of controller memory 20 for permanent data cache, may allocate a RAM portion of controller memory 20 for temporary data cache, or may reclaim the RAM portion allocated to temporary data cache for another purpose. One, some, or all of the functions of the memory management functions may be performed by one or separate elements within the storage device 12. For example, allocating memory regions for temporary data cache may be performed by Media Management Layer (MML) firmware, and reclaiming a temporary data cache may be performed by Data Path Layer (DPL) firmware.

One or more types of data may be cached in storage device 12. One type of data that may be cached in storage device 12 is host data, which is data sent to or received from the host device 10. Another type of data that may be cached in storage device 12 is control data. Other types of data for caching are contemplated. Control data may include data related to managing and/or controlling access to data stored in memory 26. The binary cache 28 may store up-to-date fragments of the logical groups (LGs). The main storage may comprise the data storage for the LGs. Control data may be used to manage the entries in memory, such as entries in binary cache 28 and main storage 30. For example, a binary cache index (BCI) may receive a Logical Block Address (LBA), and may map/point to the most up to date fragment(s) of the LG in binary cache 28. The GAT may receive the LBA address and map to the physical location of the LG in the main storage 30.

The processor 18 may assign an area of volatile memory as a "permanent" cache storage area, which is an area that cannot be reclaimed by the processor 18 for a different purpose (such as for caching of a different type of data). The processor 18 may also assign an area of volatile memory as a "temporary" cache storage area, which is an area that can be reclaimed by the memory management functions for a different purpose (such as for caching of a different type of data). As discussed in more detail with respect to FIG. 4, the processor 18 may determine whether there is a storage area available for use as a temporary data cache area. If so, the processor 18 may assign the available storage area for use as the temporary data cache area. The available storage area may be used as the temporary data cache area until the available storage area is reclaimed for another purpose.

As one example, the processor 18 may assign one or more cache storage areas for host data. In one embodiment, the processor 18 may assign a permanent cache storage area for host data and a temporary data cache storage area for host data. In this way, caching for the host data may have two distinct and separate areas (or two different levels) with the permanent cache storage area for host data and the temporary cache storage area for host data. In an alternate embodiment, the processor 18 may assign a first temporary cache storage area for host data and a second temporary cache storage area for host data. The first temporary cache storage area for host data may differ from the second temporary cache storage area for host data in one or more ways, such as in the portion or size of memory from which the temporary cache storage area is assigned and/or the circumstances under which the temporary cache storage area is reclaimed. Using the two different data caches (such as two different levels of data cache stored in volatile memory) may improve system performance, such as the data cache hit rate. Further, the temporary data cache may be created from unused or over-provisioned parts of volatile memory. In this way, the storage device 12 may more efficiently use its volatile memory. An example of one system and method of dividing a cache into temporary and permanent cache space is found in co-pending U.S. application Ser. No. 13/109,777, entitled "EXPANDABLE DATA CACHE," filed on May 17, 2011, the entirety of which is incorporated herein by reference.

Figure 2:
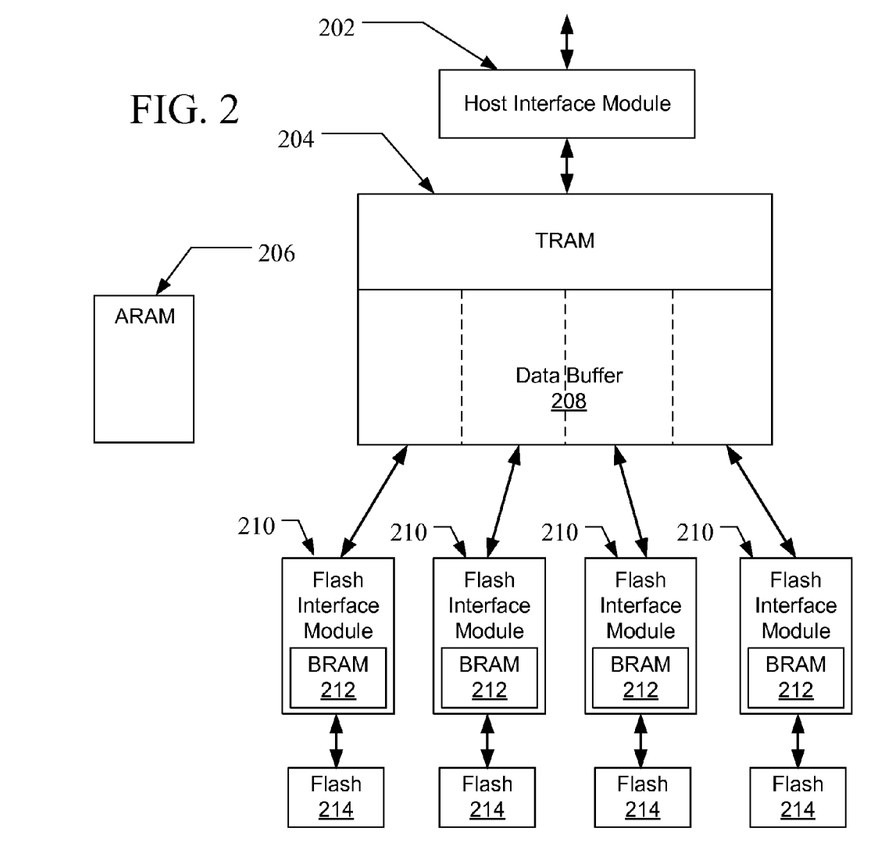
FIG. 2 illustrates a block diagram of an exemplary flash controller design.

FIG. 2 illustrates a more detailed block diagram of certain elements of controller 16 of FIG. 1, and is one example of a flash controller design. The flash controller design includes a host interface module 202 that provides the physical and electrical interface to the host system 10. The flash controller design may further include one or more volatile memories. As shown in FIG. 2, flash controller design includes multiple volatile memories, such as transfer RAM (TRAM) 204, buffer RAM (BRAM) 212, and argument RAM (ARAM) 206. The examples of ARAM, BRAM and TRAM are merely for illustration purposes only. Fewer or greater numbers of volatile memories may be used. Further, other types of RAM or different combinations of RAM may be used.

ARAM 206 may be RAM provisioned for control data caching. In this way, ARAM 206 may be considered a permanent control data caching area. For example, ARAM 206 may contain group allocation table (GAT) page cache and a logical group (LG) bit map cache. As discussed previously, part or all of the control data stored in cache flash in memory 26 may be stored in cache RAM in controller 16 to improve operation speed. For narrow logical block address (LBA) random read test or less, the permanent LG bit map cache may reduce control read (binary cache index (BCI) or group address table (GAT) page control read) to 1 control read per random read in steady state.

TRAM 204 includes a data buffer 208 that is provisioned for host data caching for host data to/from flash 214. In this way, TRAM 204 may be considered a permanent host data caching area.

The flash memory 214 may be divided into one or more different banks (such as the four banks illustrated in FIG. 2), with each bank being associated with a different flash interface module 210, and a different section of data buffer 208. In one implementation, as explained in more detail below, each section of the RAM buffer 208 may be assigned to a separate bank 214 and each section of the RAM buffer preferably has a size equal to, or greater than a size of a multi-page group (MPG) managed by the controller. More or fewer banks of flash memory 214 may be used. Also, the RAM buffer 208 may be a single buffer with partitions or separate physical RAM buffers. The flash interface module 210 may include BRAM 212, which may be provisioned for error handling and/or chip-to-chip copy. In an alternative embodiment, the BRAM 212, rather than the RAM buffer 208, may be sized as equal to or greater than the MPG managed by the controller and the BRAM 212 may be used for receiving host data via the controller for writes in to the respective bank of memory 214 associated with the particular BRAM 212.

As discussed in more detail below, the temporary data cache may be located in one or multiple shared memory regions, such as TRAM 204 or BRAM 212. Using the temporary data cache may improve operation of the storage device. For full LBA range random read test, the caching of LG bit map in the temporary cache may reduce control read (BCI) to approximately one control read per random read in steady state. For narrow LBA range random read test, the caching of GAT pages in the temporary cache will reduce control read (GAT read) to approximately zero control read/random read in steady state. An example of a way to improve address translation speed using a fast translation indicator, such as a bitmap, to reduce the need to read a secondary address table like the BCI is read is found in co-pending U.S. application Ser. No. 61/487,215, entitled "FAST TRANSLATION INDICATOR TO REDUCE SECONDARY ADDRESS TABLE CHECKS IN A MEMORY DEVICE, filed on May 17, 2011, the entirety of which is incorporated herein by reference.

Utilizing the memory system of FIGS. 1 and 2, a "middle of the road" unit of data management, a logical group referred to herein as a Multi-Page Logical Group (MPG), is implemented by the controller. The MPG is a unit of address space that is larger than a physical page, yet smaller than a physical block, of the flash memory 26. In one embodiment, this same size unit of address space is also used by the controller as the bank striping factor. The bank striping factor refers to the amount/pattern of data written to each bank 32 of flash memory 26 as each bank is written to in sequence before wrapping around to the first bank and repeating the process of writing the same amount of data into each bank. Thus, in one embodiment, a size of the physical striping factor (the amount of data written to each bank) is aligned with the size of the logical management unit (here, the multi-page logical group).

Figure 3:
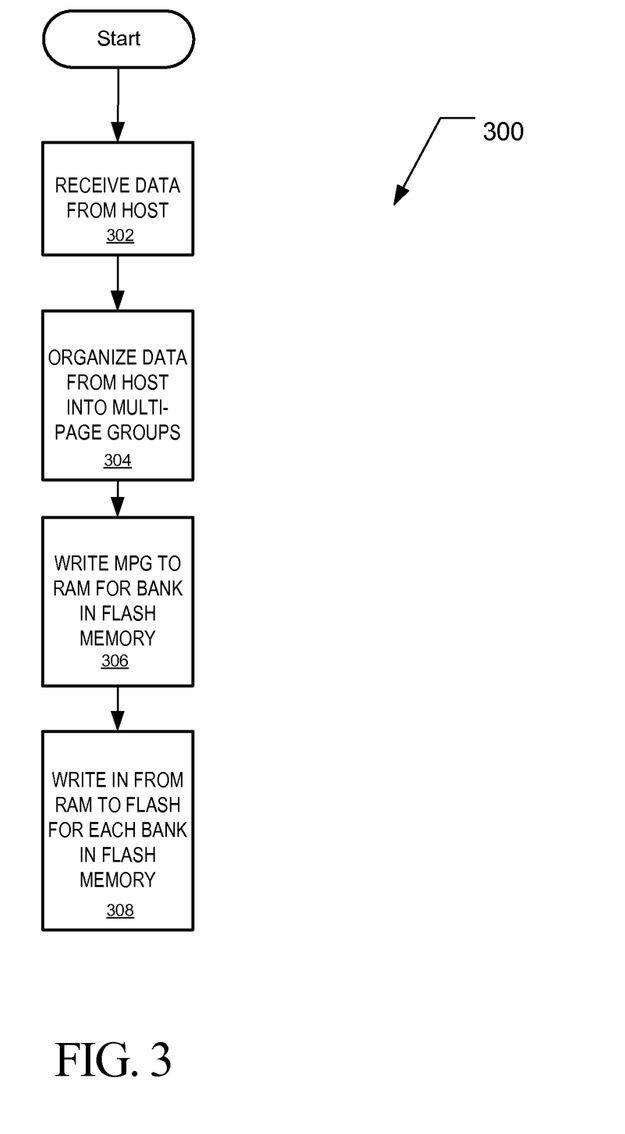
FIG. 3 is an exemplary flow diagram illustrating a method of reducing write amplification suitable for use on the memory system of FIGS. 1 and 2.

FIG. 3 shows one implementation of a method 300 for minimizing write amplification while retaining sequential read and write performance. A controller for the multi-bank storage device 12 receives host data (at 302). The controller then organizes the received data in multi-page groups (at 304). The pages for the first MPG Pages for Bank 0 are written to, and queued up in, Bank 0 buffer RAM (at 306). Next, pages for Bank 1 are queued up in Bank 1 buffer RAM. This process of striping a MPG to each bank in sequence is continued until all the received data has been written. Then all banks begin writing data in parallel from their respective buffer RAMs to NAND Flash (at 308).

This method of using MPGs and striping them across banks 32 in a multi-bank flash memory 26 may help reduce write amplification down to the single bank level, while still achieving the performance benefits of a multi-bank parallelism, by using a RAM buffer 208 that is the same size, or larger, as the MPG as explained further below.

Figure 5:
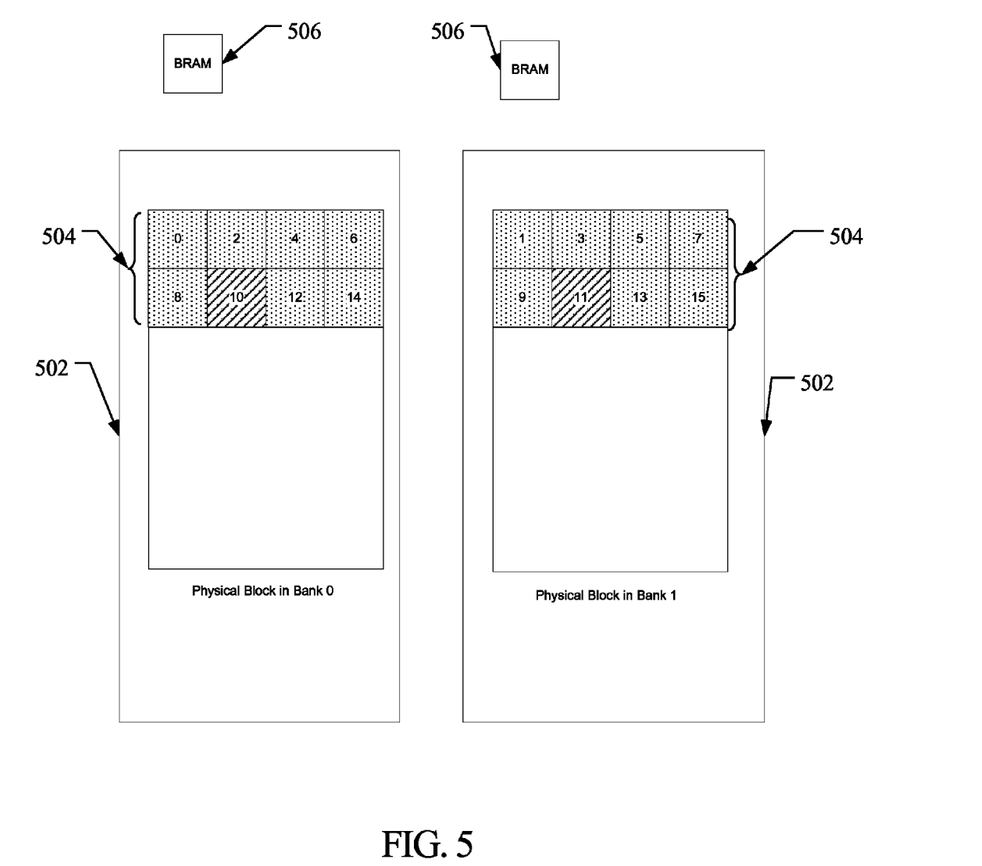
FIG. 5 shows an example of page based bank interleaving based on the arrangement of FIG. 4
Figure 6:
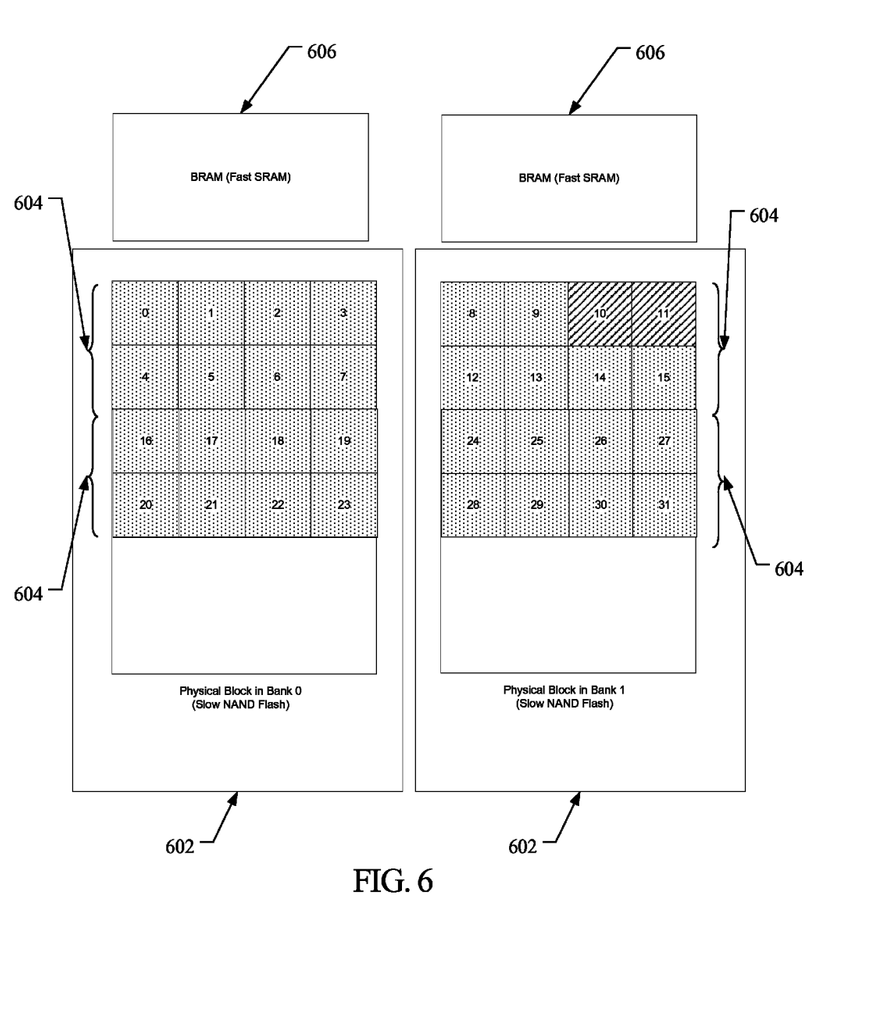
FIG. 6 shows an example of multi-page group interleaving between banks according to one implementation of the method of FIG. 3.

To illustrate one preferred memory management method, the example of FIGS. 4-6 is provided. FIG. 4 illustrates blocks 402 in two banks 404 of a multi-bank flash memory with 128 KB logical groups 406 and 16 KB aligned writes 408 from the host 10.

In a standard interleaving scheme, data is striped across banks at a page granularity, for example at 16 KB intervals as shown in FIG. 5. In this case any write that is larger than 16 KB will affect data in both banks 502 and result in two LG's 504 needing to be updated. For example, if 32 KB is written across pages 10 and 11, both LG's 504 would need to be updated. Using the formula for determining write amplification factor where the write amplification=(number of bytes written to NAND)/(number of bytes written by host), the write amplification factor is equal to (2×LG Size)/(32 KB)= (2×128 KB)/(32 KB)=256 KB/32 KB=8. The two logical groups in the calculation refer to the fact that the 2 page host write of pages 10 and 11 will affect two logical groups so that an update in NAND flash will be needed for two entire logical groups when only 32 KB was actually written by the host. In the page interleaved bank example of FIG. 5, the buffer RAM (BRAM) 506 needed is small, less than a page, because there is typically little to no significant delay that occurs when reading or writing a single page in each bank, however the write amplification factor is significant as the example above notes.

According to one embodiment of a presently preferred method, a bank interleave factor which is the same as the Multi-page Logical Group size of 64 KB in each bank 602 is shown in FIG. 6. In FIG. 6, the MPG 604 includes 8 sequential pages (128 KB) which corresponds to a two metapage logical group due to the physical alignment of the pages in the example of FIG. 6. In this example, when the same two pages (32 KB, pages 10 and 11) are written by the host as in the example of FIG. 5, only one logical group is affected by the 32 KB write and the write amplification is reduced by a factor of 2: write amplification factor=(1×LG Size)/32 KB=128 KB/32 KB=4. Thus, the write amplification factor may be improved on using a MPG as defined herein over a page based bank interleave technique.

With the arrangement of FIG. 6, however, the sequential read performance is potentially reduced by half as pages 0-7 are read first with only single bank parallelism. Then pages 8-15 are read second also with single bank parallelism. To compensate for this, enough buffer RAM 606 per bank is used to buffer an entire MPG. Additionally, for read operations the controller in the storage device implements a "read ahead" technique in idle banks, where banks affected by a host read command, but waiting their turn to be read from, preemptively read out their data into the buffer RAM. One challenge with the read ahead technique is the potential need for many control data reads relating to logical to physical translations. One technique that may accelerate such address translation is the logical bitmap referred to above.

With the features of the MPG, the buffer RAM for each bank being of equal or greater size as the MPG and the read ahead technique, sequential read performance can be maintained as follows. While pages 0-7 are being read in Bank 0, a read ahead operation can be triggered and pages 8-15 can be read simultaneously in to the 128 KB buffer in Bank 1. When Bank 0 has finished reading pages 0-7, pages 8-15 are in the buffer RAM ready for transfer to the host. This use of buffer RAM also works similarly for sequential writes. Pages for Bank 0 are queued up in Bank 0 buffer RAM. Next pages for Bank 1 are queued up in Bank 1 buffer RAM. Then both banks 602 begin writing data in parallel from buffer RAMs to NAND Flash.

There are several advantages to using MPGs with a size of 1-2 metapages such as illustrated in FIG. 6. One advantage is the reduction in the system write amplification for random writes that are smaller than: (number of banks−1)×(Logical group size). In the example of FIG. 6, this would be any random write<128 KB would see an improvement in write amplification compared to the standard physical or die pages striping factor. Also, by using MPGs, the control table needed to manage the logical groups in the system can be reduced to the point where it can fit in on-chip RAM. For example, pure page-based systems that manage 4 KB pages may require system tables on the order 128 MB. By using a logical group of 64 KB, the control table can be reduced by the factor of 64 KB/4 KB=16. For example, the 128 MB control table in a page-based system can be reduced to 8 MB. This reduction in RAM requirement can enable the tables to be more efficiently stored in on-chip memory and eliminates the need for expensive, external DRAM.

Additionally, by using multi-page logical groups on the order of 1-2 metapages in size, the storage device ensures that only coarse media fragmentation occurs. For example, fragmentation at a granularity less than a logical group won't occur. This in turn forces the storage device to balance between pro-active defragmentation at a logical group level, and lazy defragmentation at a logical group level.

Another advantage of managing data in MPGs is the reduction in the amount of computation necessary do for address translations. For example, suppose the host is writing data at a rate of 16 Megabytes per second (MB/s) to a memory device configured with a 4 KB page-based LG size. In this situation, the storage device needs to do a logical to physical translation every 16 MB/4 KB=4K translations/second. With a 2 MB LG, such as used in system with the LG having the same size as a physical block, a logical to physical translation is only needed every 16 MB/2 MB=8 translations per second. However, there is the problem of significant write amplification noted previously for random writes. Using a storage device and method as described herein, with the MPG size defined as greater than a physical page and less than a physical block and RAM per bank sized at or greater than the MPG size (assuming a 64 KB MPG) translations are only needed at a rate of 16 MB/128 KB=125 translations/second. This may lead to cost, power, and in some cases performance benefits. Yet another advantage that may be provided with the system and method described herein is a reduction in cost due the potential elimination of a need for external DRAM and the associated package/pin/logic costs associated with the use of external DRAM.

In other embodiments, the LG size and the bank striping factor may diverge. For example, the metapage size (and the bank striping factor) in a bank may be 128 KB, while the controller manages a LG size of 256 KB. Using this arrangement, and in an example memory having four banks, the LBA's split at the next bank at a 128 KB boundary, although the logical group in the bank is 256 KB. In this manner, each LG would have two 128 KB contiguous chunks with a 384 KB address gap between the two chunks. This gap may make mapping of some host writes less effective than for the case of a 256 KB contiguous write (where LG and striping factor are both 256 KB). However, this example would need only 128 KB of buffer RAM per bank compared to the need for a 256 KB buffer RAM per bank if the system had contiguous 256 KB LGs (and a 256 KB bank striping factor). Thus a 256 KB LG size and a 128 KB physical bank striping factor, where the LG size is still smaller than a block, compromises a small amount on write amplification, but may still be better than the case where the LG size is that of a block, and buffer RAM may be kept small.

As disclosed above, a method and system may be implemented to reduce write amplification performance while maintaining an advantageous level of sequential write and read performance. The method and system may include a controller in a multibank flash memory arranged to manage data in multi-page logical groups (MPGs) that are greater than a page and less than a physical block in size. The controller will write across banks using a MPG striping factor. A buffer RAM associated with each of the banks is sized to be equal to or greater than the size of the MPG.

It is intended that the foregoing detailed description be understood as an illustration of selected forms that the invention can take and not as a definition of the invention. It is only the following claims, including all equivalents, that are intended to define the scope of this invention.

We claim:

1. A multi-bank flash memory storage device comprising:
a plurality of flash memory banks, each of the plurality of flash memory banks having a physical block size and a physical page size;
volatile memory associated with each of the plurality of flash memory banks;
a controller in communication with the plurality of flash memory banks and the volatile memory associated with each of the plurality of flash memory banks, the controller configured to:
receive host data for writing to the plurality of flash memory banks;
organize the received host data into at least one multi-page group (MPG), wherein each MPG is sized greater than the physical page size, and less than the physical block size, for the plurality of flash memory banks;
interleave data writes of the received host data between the plurality of flash memory banks at a MPG granularity, wherein an entire MPG is written to a first of the plurality of flash memory banks before writing a next MPG of the received host data to a next bank in the plurality of flash memory banks;
and
wherein a size of the volatile memory associated with each of the plurality of flash memory banks, respectively, is at least as large as a size of the MPG.

2. The multi-bank flash memory storage device of claim 1, wherein the volatile memory comprises a random access memory (RAM) buffer.

3. The multi-bank flash memory storage device of claim 1, wherein the volatile memory comprises a single volatile memory partitioned such that each partition is associated with a respective one of the plurality of flash memory banks.

4. The multi-bank flash memory storage device of claim 1, wherein the volatile memory comprises a plurality of physically separate volatile memories, wherein each of the plurality of physically separate volatile memories is associated with a respective one of the plurality of flash memory banks.

5. The multi-bank flash memory storage device of claim 1, wherein the controller is configured to, after writing all of the received data to the volatile memory of each of the plurality of flash memory banks, write data from the volatile memory to non-volatile memory in each of the plurality of flash memory banks in parallel.

6. A method for limiting write amplification in a storage device comprising:
in a multi-bank flash memory device having a plurality of banks of flash storage and a volatile memory associated with each of the plurality of banks, the controller:
receiving host data for writing to the plurality of flash memory banks;
organizing the received host data into at least one multi-page group (MPG), wherein each MPG is sized greater than the physical page size, and less than the physical block size, for the plurality of flash memory banks; and
interleaving data writes of the received host data between the plurality of flash memory banks at a MPG granularity, wherein an entire MPG is written to a first of the plurality of flash memory banks before writing a next MPG of the received host data to a next bank in the plurality of flash memory banks;
and wherein a size of the volatile memory associated with each of the plurality of flash memory banks, respectively, is at least as large as a size of the MPG.

7. The method of claim 6, wherein the volatile memory comprises a random access memory (RAM) buffer and interleaving data writes comprises interleaving data writes to the RAM buffer of each of the plurality of flash memory banks.

8. The method of claim 6, wherein the volatile memory comprises a single volatile memory partitioned such that each partition is associated with a respective one of the plurality of flash memory banks.

9. The method of claim 6, wherein the volatile memory comprises a plurality of physically separate volatile memories, wherein each of the plurality of physically separate volatile memories is associated with a respective one of the plurality of flash memory banks.

10. The method of claim 6, wherein interleaving data writes comprises sequentially writing an entire MPG to the volatile memory of each of the plurality of flash memory banks and, after writing all of the received data to the volatile memory, writing data from the volatile memory to a non-volatile memory in each of the plurality of flash memory banks in parallel.

11. A multi-bank flash memory storage device comprising:
a plurality of flash memory banks, each of the plurality of flash memory banks having a physical block size and a physical page size;
volatile memory associated with each of the plurality of flash memory banks;
a controller in communication with the plurality of flash memory banks and the volatile memory associated with each of the plurality of flash memory banks, the controller configured to:
stripe received host data across each of the plurality of flash memory banks using a striping factor equal to an increment of data managed by the controller;
manage the increment of data as a multi-page logical group (MPG) sized greater than a physical page size and less than a physical block size of the plurality of flash memory banks;
wherein to stripe the received host data, the controller is configured to write an amount of data equal to the MPG size to a volatile memory associated with a first of the plurality of flash memory banks before writing a next amount of data equal to the MPG size to a volatile memory of a next one of the plurality of flash memory banks, and wherein a size of the volatile memory associated with each of the plurality of flash memory banks is at a least equal to the MPG size; and
write data from the volatile memory to non-volatile memory in each of the plurality of flash memory banks in parallel after striping the received host data across the plurality of flash memory banks.

12. The multi-bank flash memory storage device of claim 11, wherein the volatile memory comprises a random access memory (RAM) buffer.

13. The multi-bank flash memory storage device of claim 11, wherein the volatile memory comprises a single volatile memory partitioned such that each partition is associated with a respective one of the plurality of flash memory banks.

14. The multi-bank flash memory storage device of claim 11, wherein the volatile memory comprises a plurality of physically separate volatile memories, wherein each of the plurality of physically separate volatile memories is associated with a respective one of the plurality of flash memory banks.

* * * * *